United States Patent
Yang

(10) Patent No.: US 11,952,487 B2
(45) Date of Patent: Apr. 9, 2024

(54) RESIN SPACER FOR CHIP STACKING AND PACKAGING AND PREPARATION METHOD THEREOF

(71) Applicant: SU ZHOU DREAM TECHNOLOGY CO., LTD., Suzhou (CN)

(72) Inventor: Guohong Yang, Suzhou (CN)

(73) Assignee: SU ZHOU DREAM TECHNOLOGY CO., LTD., Suzhou (CN)

( * ) Notice: Subject to any disclaimer, the term of this patent is extended or adjusted under 35 U.S.C. 154(b) by 829 days.

(21) Appl. No.: 17/043,736

(22) PCT Filed: Oct. 22, 2018

(86) PCT No.: PCT/CN2018/111153
§ 371 (c)(1),
(2) Date: Sep. 30, 2020

(87) PCT Pub. No.: WO2020/034387
PCT Pub. Date: Feb. 20, 2020

(65) Prior Publication Data
US 2021/0032456 A1 Feb. 4, 2021

(30) Foreign Application Priority Data

Aug. 14, 2018 (CN) .......................... 201810923760.8

(51) Int. Cl.
| | |
|---|---|
| C08L 63/00 | (2006.01) |
| C08G 59/40 | (2006.01) |
| C08J 5/24 | (2006.01) |
| C08K 3/04 | (2006.01) |
| C08K 3/22 | (2006.01) |
| C08K 3/36 | (2006.01) |
| C08K 7/14 | (2006.01) |
| C08K 13/04 | (2006.01) |
| H01L 23/29 | (2006.01) |

(52) U.S. Cl.
CPC .......... *C08L 63/00* (2013.01); *C08G 59/4014* (2013.01); *C08J 5/244* (2021.05); *C08J 5/249* (2021.05); *C08K 3/04* (2013.01); *C08K 3/22* (2013.01); *C08K 3/36* (2013.01); *C08K 7/14* (2013.01); *C08K 13/04* (2013.01); *H01L 23/293* (2013.01); *C08K 2003/2206* (2013.01); *C08K 2003/2227* (2013.01); *C08K 2201/002* (2013.01)

(58) Field of Classification Search
None
See application file for complete search history.

(56) References Cited

U.S. PATENT DOCUMENTS

2016/0122604 A1* 5/2016 Yoshimoto ............. C08G 59/32
252/74

FOREIGN PATENT DOCUMENTS

| | | |
|---|---|---|
| CN | 104212179 A | 12/2014 |
| CN | 105164179 A | 12/2015 |
| JP | H01132651 A | 5/1989 |
| JP | 2002161194 A | 6/2002 |
| JP | 2007099933 A | 4/2007 |
| JP | 2009203289 A | 9/2009 |

* cited by examiner

*Primary Examiner* — Shawn McKinnon
(74) *Attorney, Agent, or Firm* — Bayramoglu Law Offices LLC

(57) ABSTRACT

A resin spacer for chip stacking and packaging includes a fiber glass fabric used as a base material, a weight percent of the fiber glass fabric is 10-60 wt %; and the following components are attached to the fiber glass fabric as a percentage by the total weight of the resin spacer: 8-40 wt % of epoxy resin, 10-30 wt % of quartz powder, 2-10 wt % of aluminum oxide, 1-8 wt % of calcium oxide, and 1-8 wt % of curing agent. The resin spacer further includes a pigment. The pigment has a weight percent of 1-3 wt %, and the pigment is preferably at least one selected from white carbon black and pearl powder. The resin spacer is formed by mixing, impregnating, partially curing, stacking and pressing the resin material. The thickness of the resin spacer is 0.07-0.13 mm.

15 Claims, No Drawings

RESIN SPACER FOR CHIP STACKING AND PACKAGING AND PREPARATION METHOD THEREOF

CROSS REFERENCE TO THE RELATED APPLICATIONS

This application is the national phase entry of International Application No. PCT/CN2018/111153, filed on Oct. 22, 2018, which is based upon and claims priority to Chinese Patent Application No. 201810923760.8, filed on Aug. 14, 2018, the entire contents of which are incorporated herein by reference.

TECHNICAL FIELD

The present invention relates to the technical field of spacers for packaging chips, specifically relates to a resin spacer for chip stacking and packaging and a preparation method thereof, and belongs to.

BACKGROUND

With the development of the modern integrated circuit, the chip packaging technology in the microelectronics industry has rapidly expanded from a two-dimensional stacked packaging form to a three-dimensional stacked packaging form to meet the market requirements of lighter, thinner, smaller, high-performance, low-power, and low-cost chip packaging structures. The three-dimensional stacking and packaging technology not only improves packaging densities and reduces costs, but also reduces lengths of the wires for connecting chips without increasing packaging sizes, thereby improving the performance of a device. Moreover, multi-functionalization of the device can also be implemented by stacking and packaging.

The current three-dimensional stacking and packaging form mainly includes: a stepped form and a vertical form. Both in the stepped form and the vertical form, spacers are required. The spacer is used to ensure that the chip is even and smooth during adhering, so as to protect ultra-thin chips from cracking due to the unevenness of a printed circuit board, and also, the spacer is used to ensure that there is enough space for bonding wires. However, the existing spacers for three-dimensional stacking and packaging are typically silicon-based wafer spacers. The disadvantage of this type of spacers is that the preparation process, such as filming, thinning, cutting, consumes a large amount of machine capacities, and it is limited by the sizes (a maximum size being 12 inches) of silicon-based wafer spacers, causing low yield, long preparation process, and a lot of consumptions of auxiliary materials (adhesive film, grinding wheels, cutting tools). Additionally, the silicon-based wafer spacers are more likely to crack in the processing and use, thereby lowering the yield of products and increasing production costs. In particular, the spacer is limited to a certain thickness threshold as it becomes more fragile as it becomes thinner. Therefore, the packaging size cannot be reduced beyond a certain limit by simply thinning the silicon-based wafer spacer, which in terms limits the thickness of the stacked chip.

SUMMARY

The technical problem to be resolved by the present invention is that the silicon-based wafer spacers for the existing chip packaging are fragile, have high production costs and large thicknesses. In order to solve the above technical problems, a resin spacer for chip stacking and packaging and a preparation method thereof are provided.

The technical solution adopted by the present invention for solving the technical problem is as follows.

A resin spacer for chip stacking and packaging includes a fiber glass fabric used as a base material, a weight percent of the fiber glass fabric is 10-60 wt %, and the following components are attached to the fiber glass fabric as a percentage by the total weight of the resin spacer: 8-40 wt % of epoxy resin, 10-30 wt % of quartz powder, 2-10 wt % of aluminum oxide, 1-8 wt % of calcium oxide, and 1-8 wt % of curing agent.

Preferably, in the resin spacer for chip stacking and packaging, the weight percent of the fiber glass fabric is 40-60 wt %, and the following components are attached to the fiber glass fabric as a percentage by the total weight of the resin spacer: 30-40 wt % of epoxy resin, 10-20 wt % of quartz powder, 5-10 wt % of aluminum oxide, 2-8 wt % of calcium oxide, and 4-8 wt % of curing agent.

Preferably, the epoxy resin is at least one selected from a phosphating epoxy resin, a biphenyl epoxy resin, a bisphenol epoxy resin, a novolac epoxy resin, a glycerin epoxy resin, an O-methyl novolac epoxy resin, a naphthol epoxy resin, and a dicyclopentadiene epoxy resin.

Preferably, the mesh size of the glass fiber fabric is 100-200 mesh, the mesh size of the quartz powder is 200-400 mesh, the mesh size of the aluminum oxide is 400-600 mesh, and the mesh size of the calcium oxide is 200-400 mesh.

Preferably, the curing agent is at least one selected from aliphatic amines, alicyclic amines, aromatic amines, polyamides, dicyandiamides, and imidazole compounds.

Preferably, the resign spacer for chip stacking and packaging further includes a pigment having a weight percent of 1-3 wt %, and the pigment is preferably at least one selected from white carbon black and pearl powder.

The present invention further provides a preparation method of the resin spacer for chip stacking and packaging, which includes the following steps:

S1: mixing: adding 8-40 parts by weight of epoxy resin, 10-30 parts by weight of quartz powder, 2-10 parts by weight of aluminum oxide, and 1-8 parts by weight of calcium oxide into a solvent, stirring to dissolve them, adding 1-8 parts by weight of curing agent, and dispersing them uniformly to obtain a resin gelatinous solution;

S2: impregnating: impregnating 10-60 parts by weight of fiber glass fabric into the prepared resin gelatinous solution to obtain an impregnated fabric, and controlling an impregnating amount to be 50-70 g/m$^2$;

S3: partially curing: drying the impregnated fabric and controlling the pre-curing degree at 30-50% to obtain a prepreg;

S4: stacking and pressing: laminating a plurality of prepregs, then heating and pressing them simultaneously, stopping the heating after a period of heat preservation, and obtaining the resin spacer with a certain thickness after cooling.

Preferably, the thickness of the resin spacer is 0.07-0.13 mm.

Preferably, the solvent is at least one selected from acetone, butanone, ethyl acetate, butyl acetate, ethanol, ethylene glycol monomethyl ether, ethylene glycol dimethyl ether, N,N-dimethylformamide, N,N-dimethylacetamide and N-methylpyrrolidone.

Preferably, the drying temperature in step S3 is 70-120° C.

Preferably, the heating temperature in step S4 is 150-180° C., the heat preservation time is 8-12 h, and the pressing pressure is 3-10 MPa.

The advantages of the present invention are as follows:

(1) The resin spacer for chip stacking and packaging in the present invention has good flexibility, and it is less fragile, more durable, easy to be stored, and its required manufacturing and processing method is simple. The resin spacer can be pre-processed without any limitations to its size and thickness, such that more layers of chips can be stacked on a substrate, which reduces the packaging cost, meanwhile ensures the balance of structure after completing the entire packaging, effectively avoids the warpage of the packaging structure and the crack risk of internal chips, and improves the reliability of products. However, the existing silicon-based spacers made of pure silicon are fragile during backgrinding, and the manufacturing procedure thereof requires high-precision equipment.

(2) The resin spacer for chip stacking and packaging in the present invention has excellent electrical insulation, and it can replace the silicon-based spacer widely used in chip stacking and packaging at present. The breakdown voltage of the resin spacer is greater than 39 KV/MM. The existing silicon-based spacer is a semi-insulator capable of conducting a unidirectional current, and thus the reverse breakdown voltage is generally less than 1 KV/MM.

(3) The resin spacer for chip stacking and packaging in the present invention has good hydrophilicity, it can be adhered to the chip with ordinary glue. The ether group, benzene ring, and aliphatic hydroxyl group in the curing system are not easily corroded by acid and alkali; while the existing silicon-based spacer has poor hydrophilicity, and is adhered to the chip by using professional glue that is expensive, and the silicon-based materials are easily corroded by acid and alkali.

DETAILED DESCRIPTION OF THE EMBODIMENTS

Hereinafter, the present invention is further described in detail in conjunction with embodiments.

Embodiment 1

The present embodiment provides a resin spacer for chip stacking and packaging. The resin spacer has a thickness of 0.07 mm and takes a fiber glass fabric having a mesh size of 100 mesh as a base material, a weight percent of the fiber glass fabric is 60 wt %, and the following components are attached to the fiber glass fabric as a percentage by the total weight of the resin spacer: 8 wt % of naphthol epoxy resin, 10 wt % of quartz powder having a mesh size of 200 mesh, 10 wt % of aluminum oxide having a mesh size of 400 mesh, 8 wt % of calcium oxide having a mesh size of 300 mesh, and 4 wt % of polyamides.

The present invention further provides the above preparation method of the resin spacer for chip stacking and packaging, which includes the following steps:

S1: mixing: adding 8 parts by weight of naphthol epoxy resin, 10 parts by weight of quartz powder, 10 parts by weight of aluminum oxide, and 8 parts by weight of calcium oxide into ethyl acetate, stirring to dissolve them, adding 4 parts by weight of polyamides, and dispersing them uniformly to obtain a resin gelatinous solution;

S2: impregnating: impregnating 60 parts by weight of fiber glass fabric into the prepared resin gelatinous solution to obtain an impregnated fabric, and controlling an impregnating amount to be 50 g/m$^2$;

S3: partially curing: drying the impregnated fabric at a temperature of 70° C. and controlling the pre-curing degree at 50% to obtain a prepreg;

S4: stacking and pressing: laminating a plurality of prepregs, then heating them at a temperature of 150° C., pressing them at a pressure of 3 MPa simultaneously, stopping the heating after 8 h of heat preservation, and obtaining the resign spacer with a thickness of 0.07 mm after cooling.

Embodiment 2

The present embodiment provides a resin spacer for chip stacking and packaging. The resin spacer has a thickness of 0.1 mm and takes a fiber glass fabric having a mesh size of 200 mesh as a base material, a weight percent of the fiber glass fabric is 10 wt %, and the following components are attached to the fiber glass fabric as a percentage by the total weight of the resin spacer: 17 wt % of bisphenol A epoxy resin, 20 wt % of biphenyl epoxy resin, 30 wt % of quartz powder having a mesh size of 400 mesh, 10 wt % of aluminum oxide having a mesh size of 600 mesh, 2 wt % of calcium oxide having a mesh size of 400 mesh, 8 wt % of aliphatic amines, and 3 wt % of white carbon black.

The present invention further provides the above preparation method of the resin spacer for chip stacking and packaging, which includes the following steps:

S1: mixing: adding 17 parts by weight of bisphenol A epoxy resin, 20 parts by weight of biphenyl epoxy resin, 30 parts by weight of quartz powder, 10 parts by weight of aluminum oxide, 2 parts by weight of calcium oxide and 3 parts by weight of white carbon black into N,N-dimethylformamide, stirring to dissolve them, adding 8 parts by weight of aliphatic amines, and dispersing them uniformly to obtain a resin gelatinous solution;

S2: impregnating: impregnating 10 parts by weight of fiber glass fabric into the prepared resin gelatinous solution to obtain an impregnated fabric, and controlling an impregnating amount to be 70 g/m$^2$;

S3: partially curing: drying the impregnated fabric at a temperature of 120° C. and controlling the pre-curing degree at 30% to obtain a prepreg;

S4: stacking and pressing: laminating a plurality of prepregs, then heating them at a temperature of 160° C., pressing them at a pressure of 5 MPa simultaneously, stopping the heating after 10 hour of heat preservation, and obtaining the resign spacer with a thickness of 0.1 mm after cooling.

Embodiment 3

The present embodiment provides a resin spacer for chip stacking and packaging. The resin spacer has a thickness of 0.13 mm and takes a fiber glass fabric having a mesh size of 150 mesh as a base material, a weight percent of the fiber glass fabric is 40 wt %, and the following components are attached to the fiber glass fabric as a percentage by the total weight of the resin spacer: 19 wt % of novolac epoxy resin, 10 wt % of dicyclopentadiene epoxy resin, 20 wt % of quartz powder having a mesh size of 300 mesh, 2 wt % of aluminum oxide having a mesh size of 500 mesh, 7 wt % of calcium oxide having a mesh size of 200 mesh, 1 wt % of imidazole and 1 wt % of pearl powder.

The present invention further provides the above preparation method of the resin spacer for chip stacking and packaging, which includes the following steps:

S1: mixing: adding 19 parts by weight of novolac epoxy resin, 10 parts by weight of dicyclopentadiene epoxy resin, 20 parts by weight of quartz powder, 2 parts by weight of aluminum oxide, 7 parts by weight of calcium oxide and 1 part by weight of pearl powder into acetone, stirring to dissolve them, adding 1 part by weight of imidazole, and dispersing them uniformly to obtain a resin gelatinous solution;

S2: impregnating: impregnating 40 parts by weight of fiber glass fabric into the prepared resin gelatinous solution to obtain an impregnated fabric, and controlling an impregnating amount to be 60 g/m²;

S3: partially curing: drying the impregnated fabric at a temperature of 100° C. and controlling the pre-curing degree at 40% to obtain a prepreg;

S4: stacking and pressing: laminating a plurality of prepregs, then heating them at a temperature of 180° C., pressing them at a pressure of 10 MPa simultaneously, stopping the heating after 12 h of heat preservation, and obtaining the resign spacer with a thickness of 0.13 mm after cooling.

Embodiment 4

The present embodiment provides a resin spacer for chip stacking and packaging. The resin spacer has a thickness of 0.1 mm and takes a fiber glass fabric having a mesh size of 150 mesh as a base material, a weight percent of the fiber glass fabric is 50 wt %, and the following components are attached to the fiber glass fabric as a percentage by the total weight of the resin spacer: 8 wt % of glycerin epoxy resin, 10 wt % of quartz powder having a mesh size of 300 mesh, 5 wt % of aluminum oxide having a mesh size of 500 mesh, 1 wt % of calcium oxide having a mesh size of 300 mesh, and 4 wt % of m-phenylenediamine.

The present invention further provides the above preparation method of the resin spacer for chip stacking and packaging, which includes the following steps:

S1: mixing: adding 30 parts by weight of glycerin epoxy resin, 10 parts by weight of quartz powder, 5 parts by weight of aluminum oxide, and 1 part by weight of calcium oxide into ethylene glycol monomethyl ether, stirring to dissolve them, adding 4 parts by weight of m-phenylenediamine, and dispersing them uniformly to obtain a resin gelatinous solution;

S2: impregnating: impregnating 50 parts by weight of fiber glass fabric into the prepared resin gelatinous solution to obtain an impregnated fabric, and controlling an impregnating amount to be 60 g/m²;

S3: partially curing: drying the impregnated fabric at a temperature of 100° C. and controlling the pre-curing degree at 40% to obtain a prepreg;

S4: stacking and pressing: laminating a plurality of prepregs, then heating them at a temperature of 180° C., pressing them at a pressure of 10 MPa simultaneously, stopping the heating after 12 h of heat preservation, and obtaining the resign spacer with a thickness of 0.1 mm after cooling.

Embodiment 5

The present embodiment provides a resin spacer for chip stacking and packaging. The resin spacer has a thickness of 0.1 mm and takes a fiber glass fabric having a mesh size of 150 mesh as a base material, a weight percent of the fiber glass fabric is 40 wt %, and the following components are attached to the fiber glass fabric as a percentage by the total weight of the resin spacer: 30 wt % of phosphating epoxy resin, 16 wt % of quartz powder having a mesh size of 300 mesh, 6 wt % of aluminum oxide having a mesh size of 500 mesh, 3 wt % of calcium oxide having a mesh size of 300 mesh, and 5 wt % of dicyandiamide.

The present invention further provides the above preparation method of the resin spacer for chip stacking and packaging, which includes the following steps:

S1: mixing: adding 30 parts by weight of phosphating epoxy resin, 16 parts by weight of quartz powder, 6 parts by weight of aluminum oxide, and 3 part by weight of calcium oxide into N-methylpyrrolidone, stirring to dissolve them, adding 5 parts by weight of dicyandiamide, and dispersing them uniformly to obtain a resin gelatinous solution;

S2: impregnating: impregnating 40 parts by weight of fiber glass fabric into the prepared resin gelatinous solution to obtain an impregnated fabric, and controlling an impregnating amount to be 60 g/m²;

S3: partially curing: drying the impregnated fabric at a temperature of 100° C. and controlling the pre-curing degree at 40% to obtain a prepreg;

S4: stacking and pressing: laminating a plurality of prepregs, then heating them at a temperature of 160° C., pressing them at a pressure of 8 MPa simultaneously, stopping the heating after 10 h of heat preservation, and obtaining the resign spacer with a thickness of 0.1 mm after cooling.

EFFECT EXAMPLE

According to the ASTM D-149 standard, the breakdown voltage of the resin spacer in Embodiments 1-5 can be measured by the Dielectric Breakdown Tester and 710-56A-B that are provided by Haefely Hitronics. The breakdown voltages of the resin spacers in Embodiments 1-5 are 21 KV/MM, 30 KV/MM, 39 KV/MM, 29 KV/MM, 31 KV/MM in sequence, while the reverse breakdown voltage of the existing silicon-based spacer is generally less than 1 KV/MM. As a result, the resin spacer for chip stacking and packaging in the present invention has excellent electrical insulation.

Based on the above ideal embodiments and descriptions according to the present invention, the person skilled in the prior art can make various changes and modifications without departing from the scope of the technical concept of the present invention. The technical scope of the present invention is not limited to the contents of the description, and the technical scope must be determined according to the scope of the claims.

What is claimed is:

1. A resin spacer for chip stacking and packaging, comprising a fiber glass fabric used as a base material, wherein
a weight percent of the fiber glass fabric is 10-60 wt %, and the resin spacer further comprises: 8-40 wt % of epoxy resin, 10-30 wt % of quartz powder, 2-10 wt % of aluminum oxide, 1-8 wt % of calcium oxide, and 1-8 wt % of curing agent, and wherein
the glass fiber fabric has a mesh size of 100-200 mesh, the quartz powder has a mesh size of 200-400 mesh, the aluminum oxide has a mesh size of 400-600 mesh, and the calcium oxide has a mesh size of 200-400 mesh.

2. The resin spacer of claim 1, wherein the weight percent of the fiber glass fabric is 40-60 wt %, and the resin spacer further comprises: 30-40 wt % of the epoxy resin, 10-20 wt % of the quartz powder, 5-10 wt % of the aluminum oxide, 2-8 wt % of the calcium oxide, and 4-8 wt % of the curing agent.

3. The resin spacer of claim 1, wherein the epoxy resin is at least one selected from the group consisting of a phosphating epoxy resin, a biphenyl epoxy resin, a bisphenol epoxy resin, a novolac epoxy resin, a glycerin epoxy resin, an O-methyl novolac epoxy resin, a naphthol epoxy resin, and a dicyclopentadiene epoxy resin.

4. The resin spacer of claim 1, wherein the curing agent is at least one selected from the group consisting of aliphatic amines, alicyclic amines, aromatic amines, polyamides, dicyandiamides, and imidazole compounds.

5. The resin spacer of claim 1, further comprising a pigment, wherein the pigment has a weight percent of 1-3 wt %, and the pigment is at least one selected from the group consisting of white carbon black and pearl powder.

6. A method of preparing a resin spacer for chip stacking and packaging, characterized in comprising the following steps:
   S1: mixing: adding 8-40 parts by weight of epoxy resin, 10-30 parts by weight of quartz powder, 2-10 parts by weight of aluminum oxide, and 1-8 parts by weight of calcium oxide into a solvent to obtain a first mixture, stirring to dissolve the first mixture, adding 1-8 parts by weight of curing agent to obtain a second mixture, and dispersing the second mixture uniformly to obtain a resin gelatinous solution;
   S2: impregnating: impregnating 10-60 parts by weight of fiber glass fabric into the resin gelatinous solution to obtain an impregnated fabric, and controlling an impregnating amount to be 50-700 $g/m^2$;
   S3: partially curing: drying the impregnated fabric and controlling the pre-curing degree at 30-50% to obtain a prepreg;
   S4: stacking and pressing: laminating a plurality of prepregs, then heating and pressing them simultaneously, stopping the heating after a period of heat preservation, and obtaining the resin spacer with a thickness after cooling.

7. The method of claim 6, wherein the thickness of the resin spacer is 0.07-0.13 mm.

8. The preparation method of claim 6, wherein the solvent is at least one selected from the group consisting of acetone, butanone, ethyl acetate, butyl acetate, ethanol, ethylene glycol monomethyl ether, ethylene glycol dimethyl ether, N,N-dimethylformamide, N,N-dimethylacetamide, and N-methylpyrrolidone.

9. The preparation method of claim 6, wherein a drying temperature in step S3 is 70-120° C., a heating temperature in step S4 is 150-180° C., a heat preservation time is 8-12 hours, and a pressing pressure is 3-10 MPa.

10. The resin spacer of claim 2, wherein the epoxy resin is at least one selected from the group consisting of a phosphating epoxy resin, a biphenyl epoxy resin, a bisphenol epoxy resin, a novolac epoxy resin, a glycerin epoxy resin, an O-methyl novolac epoxy resin, a naphthol epoxy resin, and a dicyclopentadiene epoxy resin.

11. The resin spacer of claim 2, wherein the curing agent is at least one selected from the group consisting of aliphatic amines, alicyclic amines, aromatic amines, polyamides, dicyandiamides, and imidazole compounds.

12. The resin spacer of claim 3, wherein the curing agent is at least one selected from the group consisting of aliphatic amines, alicyclic amines, aromatic amines, polyamides, dicyandiamides, and imidazole compounds.

13. The resin spacer of claim 2, further comprising a pigment, wherein the pigment has a weight percent of 1-3 wt %, and the pigment is at least one selected from the group consisting of white carbon black and pearl powder.

14. The resin spacer of claim 3, further comprising a pigment, wherein the pigment has a weight percent of 1-3 wt %, and the pigment is at least one selected from the group consisting of white carbon black and pearl powder.

15. The resin spacer of claim 4, further comprising a pigment, wherein the pigment has a weight percent of 1-3 wt %, and the pigment is at least one selected from the group consisting of white carbon black and pearl powder.

* * * * *